United States Patent
Nguyen et al.

(10) Patent No.: US 6,958,566 B2
(45) Date of Patent: Oct. 25, 2005

(54) MECHANICAL RESONATOR DEVICE HAVING PHENOMENA-DEPENDENT ELECTRICAL STIFFNESS

(75) Inventors: Clark T.-C. Nguyen, Arlington, VA (US); Wan-Thai Hsu, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 0 days.

(21) Appl. No.: 10/217,877

(22) Filed: Aug. 13, 2002

(65) Prior Publication Data

US 2003/0051550 A1 Mar. 20, 2003

Related U.S. Application Data

(60) Provisional application No. 60/312,905, filed on Aug. 16, 2001.

(51) Int. Cl.[7] .............................................. H01L 41/02
(52) U.S. Cl. ........................................ 310/321; 310/365
(58) Field of Search ................................. 310/306, 309, 310/321, 365; 333/154–156, 158, 160–164

(56) References Cited

U.S. PATENT DOCUMENTS

| 3,614,483 | A | * | 10/1971 | Berlincourt | 310/321 |
|---|---|---|---|---|---|
| 4,334,168 | A | * | 6/1982 | Besson et al. | 310/343 |
| 5,548,178 | A | * | 8/1996 | Eda et al. | 310/349 |
| 5,589,082 | A | * | 12/1996 | Lin et al. | 216/2 |
| 5,783,973 | A | | 7/1998 | Weinberg et al. | 331/35 |
| 5,903,380 | A | * | 5/1999 | Motamedi et al. | 359/224 |
| 6,374,677 | B1 | * | 4/2002 | Berlin et al. | 73/662 |
| 6,625,004 | B1 | * | 9/2003 | Musolf et al. | 361/278 |
| 6,677,695 | B2 | * | 1/2004 | Dhuler et al. | 310/309 |
| 6,710,680 | B2 | * | 3/2004 | Niu et al. | 333/186 |

FOREIGN PATENT DOCUMENTS

| DE | 2339230 A1 | * | 2/1975 | ............ B06B/1/06 |
|---|---|---|---|---|
| EP | 0797300 A1 | * | 9/1997 | ............ H03H/3/02 |
| JP | 05-022071 | * | 1/1993 | ............ H03H/9/19 |
| JP | 5-175775 | * | 7/1993 | ................ 333/187 |
| JP | 11-168339 | * | 6/1999 | ............ H03H/3/08 |

OTHER PUBLICATIONS

Bannon, Frank D. III, et al., High–Q HF Microelectromechanical Filters, IEEE Journal of Solid–State Circuits, vol. 35, No. 4, Apr. 2000, pp. 512–526.

Nguyen, Clark T.–C., Frequency–Selective MEMS For Miniaturized Low–Power Communication Devices, IEEE Trans. Microwave Theory Tech., vol. 47, No. 8. pp. 1486–1503, Aug. 1999.

(Continued)

*Primary Examiner*—Thomas M. Dougherty
(74) *Attorney, Agent, or Firm*—Brooks Kushman P.C.

(57) ABSTRACT

A mechanical resonator device which has a phenomena-dependent electrical stiffness is provided. The phenomena may be temperature or acceleration, for example. The device includes a substrate and a resonator supported above the substrate by supports. The device further includes an electrode supported above the substrate adjacent the resonator by supports to obtain an electrode-to-resonator gap wherein electrical stiffness generated across the gap is phenomena-dependent to take instability of resonant frequency of the device caused by the phenomena into consideration.

30 Claims, 6 Drawing Sheets

OTHER PUBLICATIONS

Nguyen, Clark T.–C., et al., An Integrated CMOS Micromechanical Resonator High–Q Oscillator, IEEE Journal of solid–State Circuits, vol. 34, No. 4, pp. 440–447, Apr. 1999.

Wan–Thai Hsu, et al., Geometric Stress Compensation For Enhanced Thermal Stability In Micromechanical Resonators, IEEE International Ultrasonics Symposium, Sendai, Japan, Oct. 5–8, 1998, pp. 945–948.

Nguyen, Clark T.–C., Micromachining Technologies For Miniaturized Communication Devices, Proceedings of SPIE: Micromachining and Microfabrication, Santa Clara, California, Sep. 20–22, 1998, pp. 24–38.

Wang, Kun, et al., VHF Free–Free Beam High–Q Micromechanical Resonators, Technical Digest, $12^{th}$ International IEEE Micro Electro Mechanical Systems Conference, Orlando, Florida, Jan. 17–21, 1999, pp. 453–458.

Nguyen, Clark T.–C., Frequency–Selective MEMS For Miniaturized Communication Devices, Proceedings, 1998 IEEE Aerospace Conference, vol. 1, Snowmass, Colorado, Mar. 21–28, 1998, pp. 445–460.

Hsu, Wan–Thai, et al., Mechanically Temperature–Compensated Flexural–Mode Micromechanical Resonators, International Electron Devices Meeting 2000. IEDM Technical Digest, San Francisco, California, Dec. 10–13, 2000.

* cited by examiner

MECHANICAL RESONATOR DEVICE HAVING PHENOMENA-DEPENDENT ELECTRICAL STIFFNESS

CROSS-REFERENCE TO RELATED APPLICATIONS

This application claims the benefit of U.S. provisional application Ser. No. 60/312,905, filed Aug. 16, 2001 and entitled "Stiffness-Compensated Temperature-Insensitive Mechanical Resonators." This application is related to U.S. patent application Ser. No. 09/938,412, filed Aug. 23, 2001 and entitled "Micromechanical Resonator Device."

STATEMENT REGARDING FEDERALLY SPONSORED RESEARCH OR DEVELOPMENT

This invention was made with Government support under DARPA Contract No. F 30602-97-0101. The Government has certain rights in the invention.

BACKGROUND OF THE INVENTION

1. Field of the Invention

This invention relates to mechanical resonator devices having phenomena-dependent electrical stiffness.

2. Background Art

Recent advances in micromachining technology that yield high-Q micro-scale mechanical resonators may soon enable substantial size and cost reductions for the highly stable oscillators used in communication and timekeeper applications. In particular, IC-compatible surface-micromachined mechanical resonators from MF to VHF frequencies with Q's in excess of 10,000 have been demonstrated in polycrystalline silicon structure materials as described in C. T. -c. Nguyen, "Frequency-Selective MEMS for Miniaturized Low-Power Communication Devices (invited)," IEEE TRANS. MICROWAVE THEORY TECH., Vol. 47, No. 8, pp. 1486–1503, August 1999.

Prototype high-Q oscillators feature micromechanical (or "$\mu$mechanical") resonators integrated together with sustaining electronics, all in a single chip, using a planar process that combines surface-micromachining and integrated circuits, have also been demonstrated as described in "C. T. -C. Nguyen and R. T. Howe, "An Integrated CMOS Micromechanical Resonator High-Q Oscillator," IEEE SOLID-STATE CIRCUITS, Vol. 34, No. 4, pp. 440–445, April 1999.

Figure 1:
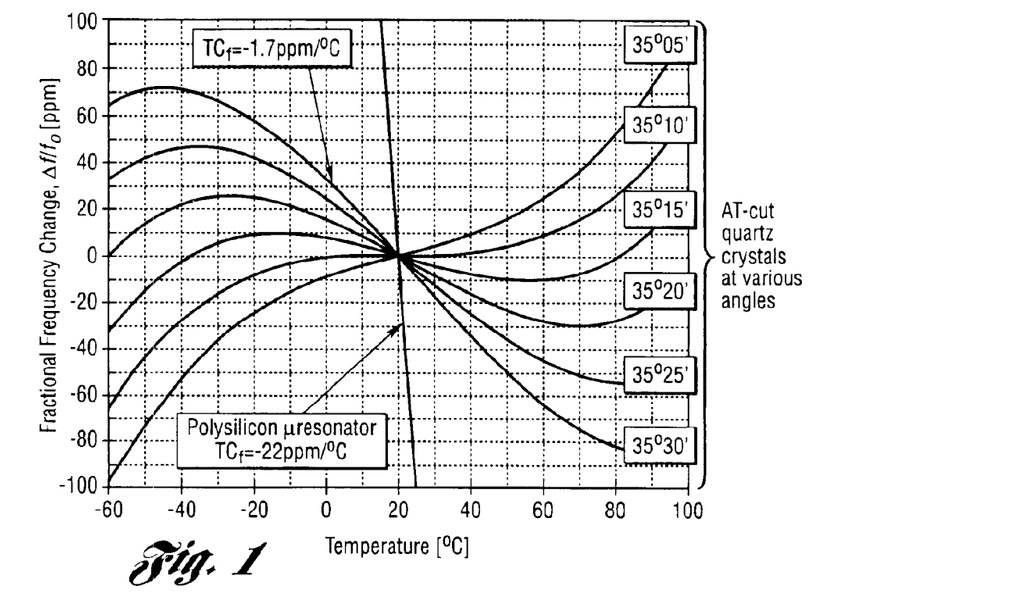
FIG. 1 shows graphs or plots of fractional frequency change versus temperature for an equal-folded beam polysilicon μmechanical resonator and AT-cut quartz crystals with various cut angles.

Unfortunately, although the Q of the resonators in these oscillators is sufficient to garner respectable short-term stability, their thermal stability falls well short of the needed specifications, typically exhibiting frequency variations on the order of 1870 ppm over a 0° C. to 85° C. range, as shown in FIG. 1, which compares the performance of a polysilicon folded beam $\mu$mechanical resonator with that of AT-cut quartz. Although techniques exist to alleviate this thermal dependence (e.g., temperature compensation circuitry, or oven control), all of them consume significant amounts of power, and thus, reduce the battery lifetime of the portable devices.

The above-noted pending application entitled "Micromechanical Resonator Device" discloses a geometric stress-compensated device that utilized strategic geometrical design of a resonator and its support structure to introduce temperature-dependent stresses on its resonator beam that counteract temperature-induced frequency shifts caused largely by Young's modulus temperature dependence.

In the article entitled "Geometric Stress Compensation for Enhanced Thermal Stability in Micromechanical Resonators," W. -T. Hsu et al., ULTRAS. SYMP., 1998, pp. 945–948, a geometric stress-compensation design technique is disclosed with respect to low-frequency (LF, e.g., 80 kHz) nickel folded-beam $\mu$mechanical resonators that used a geometrically-tailored stress-versus-temperature function to cancel the thermal dependence of the material Young's modulus, resulting in an overall lower frequency excursion over a given temperature range, and generating zero temperature coefficient $TC_{fo}$ points in the process.

Other related articles include: C. T. -C Nguyen, "Micromachining Technologies for Miniaturized Communication Devices," PROCEEDINGS OF SPIE: MICROMACHINING AND MICROFABRICATIONS, Santa Clara, Calif., Sep. 20–22, 1998, pp. 24–38; Kun Wang et al., "VHF Free-Free Beam High-Q Micromechanical Resonators," XP-000830790, Jan. 17, 1999, pp. 453–458; and C. T. -C Nguyen, "Frequency-Selective MEMS For Miniaturized Communication Devices," IEEE, 1998, pp. 445–460.

SUMMARY OF THE INVENTION

An object of the present invention is to provide a mechanical resonator device having phenomena-dependent electrical stiffness.

In carrying out the above object and other objects of the present invention, a mechanical resonator device having a resonant frequency is provided. The device includes a resonator and an electrode adjacent the resonator to obtain an electrode-to-resonator gap wherein electrical stiffness generated across the gap is phenomena-dependent to take instability of the resonant frequency caused by the phenomena into consideration.

The phenomena may be temperature, or may be acceleration.

Distance across the capacitive gap between the electrode and the resonator may vary as a function of temperature.

The device may include supports for supporting the resonator and the electrode. A material of the resonator and its supports may expand at a different rate than a material of the electrode and its supports due to temperature.

The device may be substantially temperature-insensitive without the need for additional power consumption.

The resonator may be a polysilicon resonator such as a polysilicon resonator beam.

The device may include a substrate and supports for supporting the resonator and the electrode above the substrate. The substrate may be a semiconductor substrate such as a silicon substrate.

The device may have a frequency-versus-phenomena curve, which may be specifically tailored.

The device may have a substantially zero temperature coefficient temperature at which the device may be biased.

The device may be a two-port, vertical, micromechanical resonator device.

The electrode may be supported above or below the resonator.

Distance across the gap and operating voltage of the electrode may substantially cancel resonant frequency shifts caused by temperature.

The device may further include a drive electrode structure formed at a position to allow electrostatic excitation of the resonator, and the resonator and the drive electrode structure may define a gap therebetween.

The resonator may be a single resonator beam.

The electrode may be a metal electrode such as a plated metal electrode.

The device may be a phenomena sensor such as a temperature sensor or an acceleration sensor.

The supports for the electrode may include at least one pair of off-axis anchors.

The electrode may be cut to reduce lateral expansion-induced stress in the electrode.

The gap may be a capacitive gap and the resonator may be a flexural mode resonator.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 5 is a graph of which illustrates the frequency characteristic for a 10 MHz version of the resonator of FIG. 2a;

FIG. 6 are graphs or plots of fractional frequency change versus temperature for the resonator of FIG. 2a;

FIG. 7 are graphs or plots of fractional frequency change versus temperature for the resonator of FIG. 4a.

DETAILED DESCRIPTION OF THE PREFERRED EMBODIMENTS

In general, the mechanical resonator and system design disclosed herein offers a method for taking into consideration including negating the thermal dependencies described in the Background Art without the need for additional power consumption. With this invention, the thermal stability of a micromechanical resonator can be made even better than that of a quartz crystal resonator.

In cases where power is not a large concern, the temperature-insensitive design technique described herein can be combined with temperature compensating or oven-control circuits to attain thermal stabilities superior to those achievable via present-day macroscopic resonators at a given power level.

The disclosed resonator is designed to vibrate in a flexural mode, for which temperature dependence is dominated by the following factors: (1) stress changes due to thermal expansion or contraction of clamped beams; (2) Young's modulus temperature dependence; and (3) dimensional changes due to thermal expansion or contraction of released beams. However, it is to be understood that the resonator may be a resonator which operates in other modes such as radial contour-mode, wine-glass mode or any other mode.

Of the above causes, Young's modulus and stress variations with temperature have the strongest impact on resonance frequency. For the majority of current resonator designs, these two causes combined to yield a monotonically decreasing resonance frequency-versus-temperature curve. For example, the resonance frequency of a phosphorous-doped polysilicon clamped-clamped beam resonator has a negative Young's modulus temperature coefficient ($TC_f$) and a negative $TC_f$ due to clamped-beam expansion. These $TC_f$'s add to yield a net negative temperature coefficient.

The high-Q, temperature-insensitive mechanical resonator disclosed herein takes advantage of strategic electrode design and construction to realize an electrical spring stiffness, $k_e$ that varies with temperature (i.e., that is a function of temperature). Doing this makes the resonance frequency, $f_o$, a function of temperature according to the equation:

$$f_o = \sqrt{\frac{k_m - k_e}{m_r}} \quad (1)$$

where $k_m$ is the mechanical stiffness of the resonator (with no applied dc-bias $V_p$) and $m_r$ is the effective dynamic mass of the resonator. The electrical stiffness $k_e$ is given approximately by the expression (neglecting gap space variation due to beam bending):

$$k_e = \frac{V_p^2 \varepsilon_o A}{d^3} \quad (2)$$

where $V_p$ is the dc-bias voltage, A is the overlap area, $\varepsilon_o$ is the permittivity in vacuum, and d is the gap spacing between electrode and resonator. As indicated in (2), the electrical stiffness generated across an electrode-to-resonator capacitive gap depends strongly upon the gap spacing d.

Thus, one method for making electrical stiffness a function of temperature is to realize an electrode-to-resonator gap that varies with temperature.

Figure 2A:
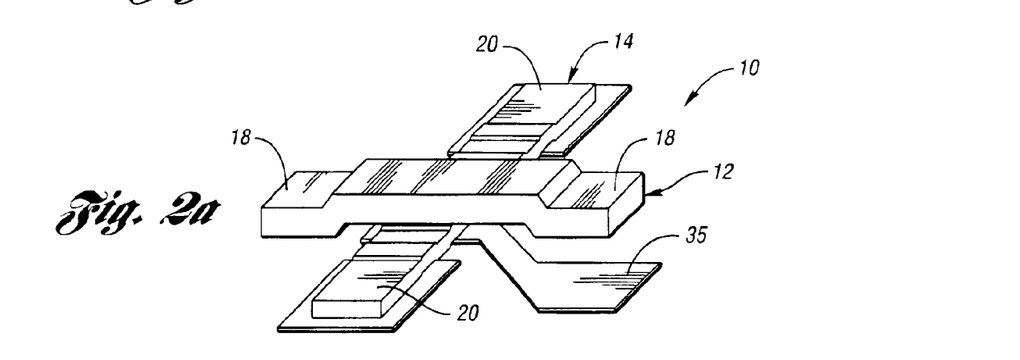
FIG. 2a is a perspective schematic view of a temperature-insensitive micromechanical resonator constructed in accordance with the present invention.

FIG. 2a presents a perspective schematic view of one preferred embodiment of a resonator device, generally indicated at 10, of the present invention. In this embodiment, an overhead electrode, generally indicated at 12 (i.e., the top electrode), has been added above a clamped-clamped beam vertical micromechanical resonator, generally indicated at 14. The overhanging electrode structure or electrode 12 is itself anchored to a substrate, generally indicated at 16 in FIG. 2b, at its ends via conventional clamped-clamped beam anchors 18.

Figure 2B:
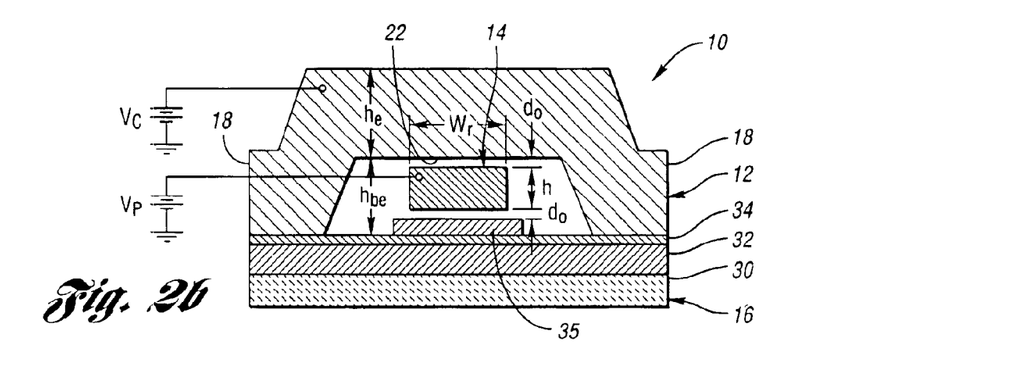
FIG. 2b is a sectional view of the resonator of FIG. 2a illustrating dimensions and electrical biasing.
Figures 2C, 3A:
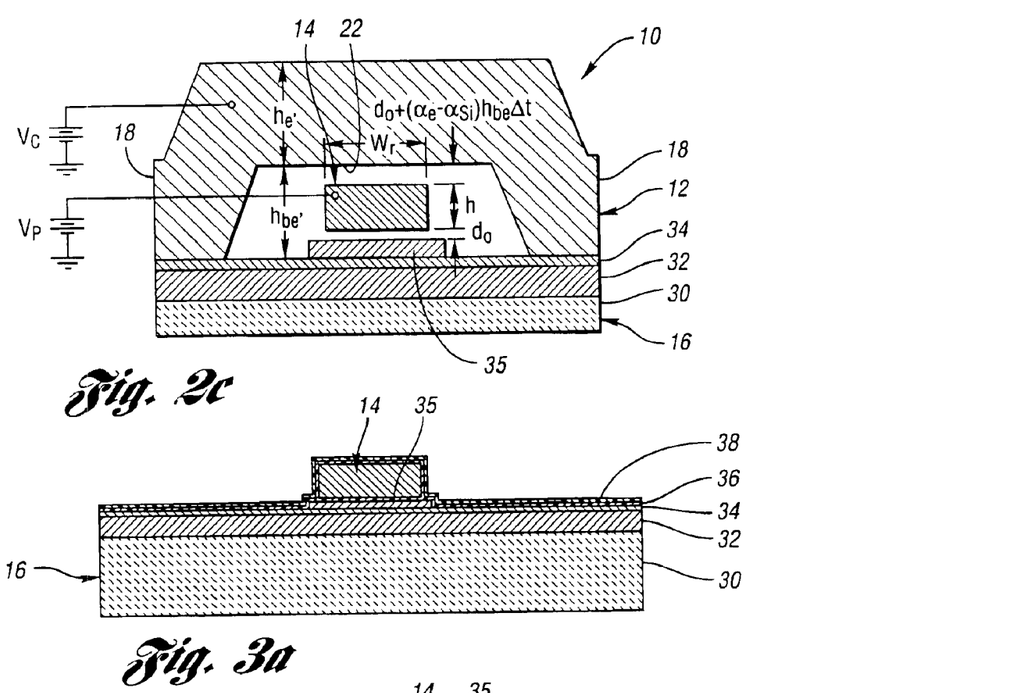
FIG. 2c is a sectional view similar to the view of FIG. 2b but at an elevated temperature and having a larger top electrode-to-resonator gap.
FIGS. 3a–3h are sectional views which illustrate a sample process flow for making a resonator of the present invention.

As shown in FIG. 2b (a sectional view of FIG. 2a), the top electrode 12 is effectively supported by blocks or anchors 18 constructed of a material that expands faster than anchors 20 and structural material of the mechanical resonator 14. With this selection of materials, the bottom surface of the top electrode 12 moves vertically upward faster than the top surface of the resonator beam 14 moves up (by thermal expansion of the resonator anchors 20 and its beam thickness), resulting in a net increase in the top electrode-to-resonator gap 22 spacing, as shown in FIG. 2c, which is a sectional view similar to FIG. 2b but at a higher temperature. This increase in the gap 22 spacing then leads to a decrease in the electrical spring constant over the top electrode-to-resonator capacitive gap 22 and a corresponding increase in the resonance frequency, as governed by equations (1) and (2), respectively.

By choosing appropriate values of dc-bias voltage $V_p$ and initial gap 22 spacing $d_o$, this resonance frequency increase can be tailored to exactly cancel the resonance frequency decrease with temperature arising from a combination of Young's modulus and expansion-induced stress temperature dependencies. An expression for the expected temperature coefficient as a function of design variables can be given as:

$$TC_f = (\alpha_{E_r} - \alpha_r) + \frac{3}{2} \frac{(V_p - V_C)^2 \varepsilon_o A}{d_o^4 k_m} (\alpha_e - \alpha_r) h_{be} \qquad (3)$$

where $\alpha_{E_r}$ is the temperature coefficient of the Young's modulus of the resonator material, $V_C$ is a control voltage applied to the top electrode 12, $k_m$ is the mechanical spring constant of the resonator beam 14, $h_{be}$ is the gap between the substrate 16 and the bottom surface of the overhead electrode 12, and $\alpha_e$ and $\alpha_r$ are the thermal expansion coefficients of the electrode 12 and the resonator 14, respectively.

The embodiment of FIG. 2a represents one of several possible designs for a temperature-insensitive micromechanical resonator based on this variable electrical spring constant principle.

Figure 3B:
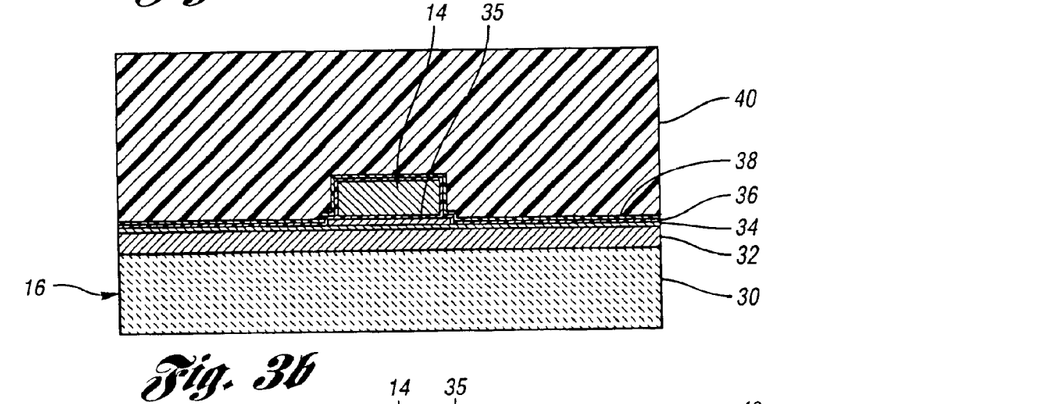
Figure 3C:
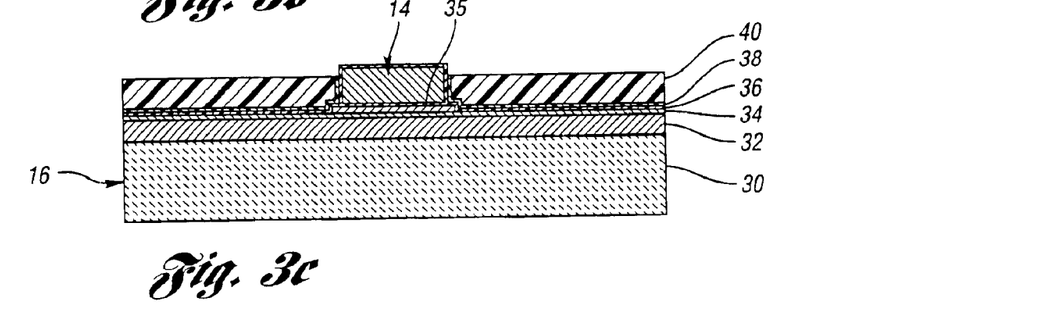
Figure 3D:
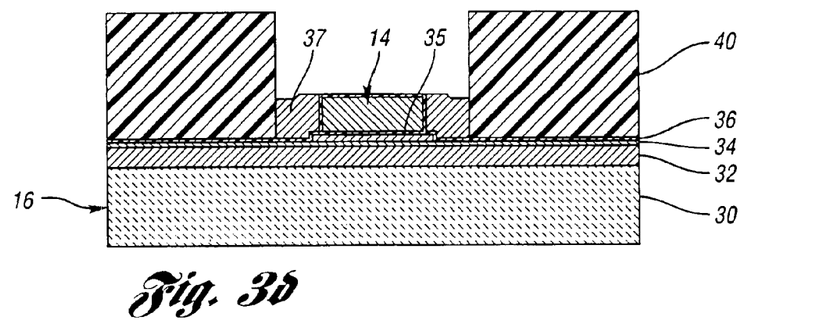
Figure 3E:
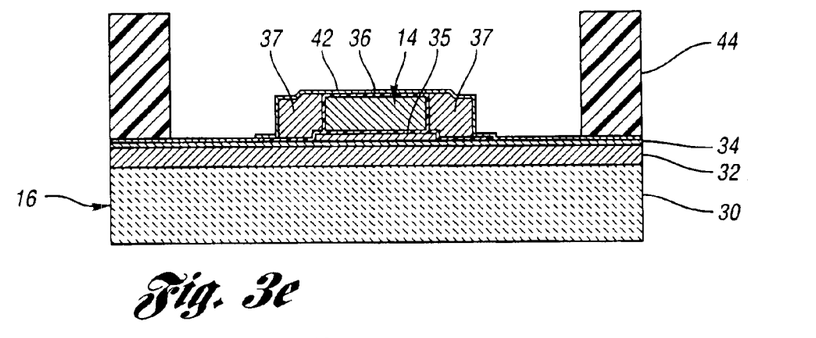
Figure 3F:
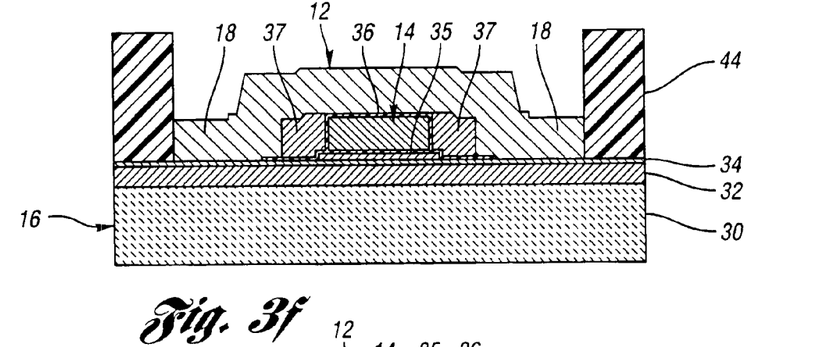
Figure 3G:
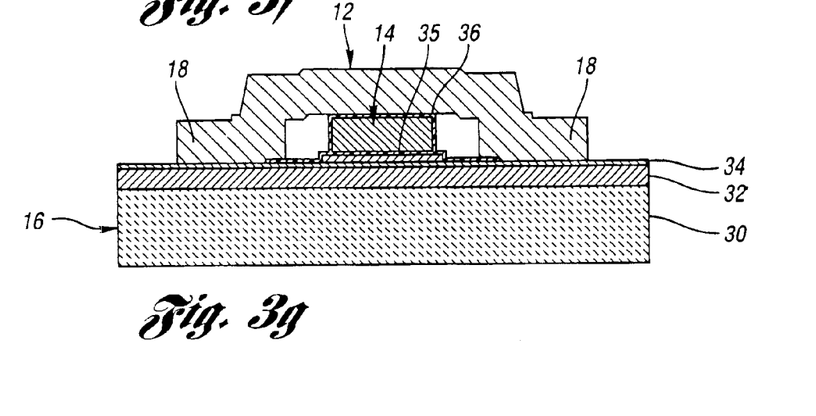
Figure 3H:
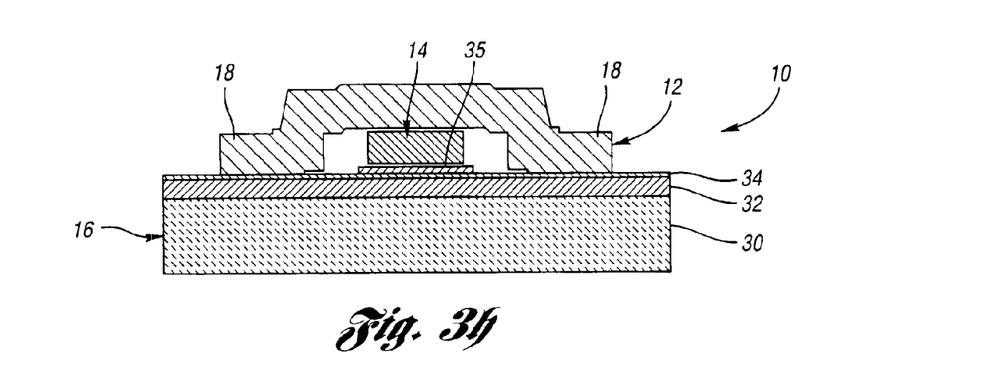

FIGS. 3a–3h present a sample process flow for making the device 10 of FIG. 2a. As shown, the process begins with a standard high frequency vertical resonator surface micromachining process that yields the cross-section of FIG. 3a including a Si-substrate layer 30, an oxide film 32, a nitride film 34, an Ni seed layer 38 and a polysilicon layer 35, which becomes a drive electrode 35 of FIGS. 2a–2c. The resonator structure 14 is defined, but the sacrificial oxide and oxide mask layers 36 still remain. At this point, the process deviates from that of conventional surface-micromachining, in that instead of doing an HF release step, a Ni sacrificial spacer layer 37 is formed around the resonator structure 14 via electroplating through an appropriate photoresist mold 40 to yield the cross-section in FIG. 3d. The seed layer 38 is removed in FIG. 3c from the top of the resonator 14. After removal of the mold 40 and the seed layer 38 used to form the sacrificial layer 37, another metal (Cr/Au/Cr) seed layer 42 and mold 44 are applied (as shown in FIG. 3e), and the Au for the top electrode structure 12 is then electroplated (as shown in FIG. 3f). The mold 44, the layer 37 and seed layer 42 for this step are removed and the whole structure is released in HF, leaving the free-standing final cross-section of FIG. 3h.

Figure 4A:
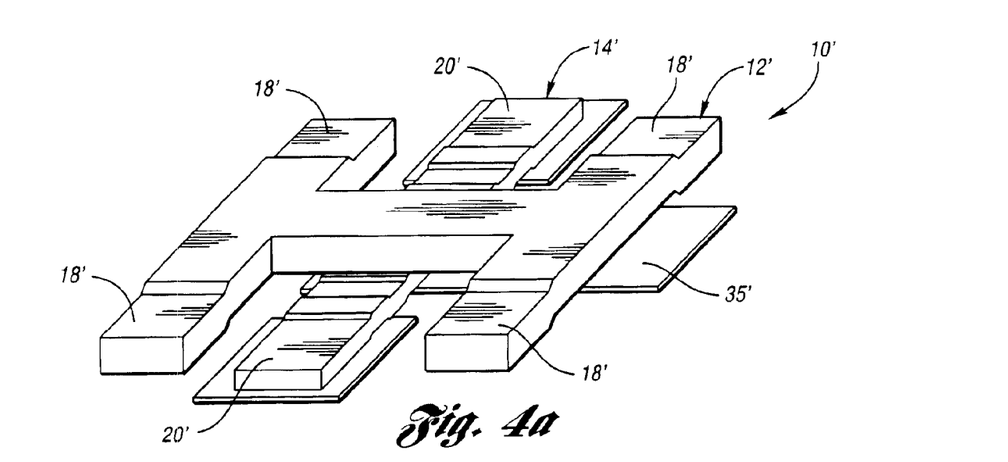
FIG. 4a is a perspective schematic view of another embodiment of a resonator of the invention wherein the top electrode has split anchors to suppress the effort of top-to-bottom expansion gradients.
Figure 4B:
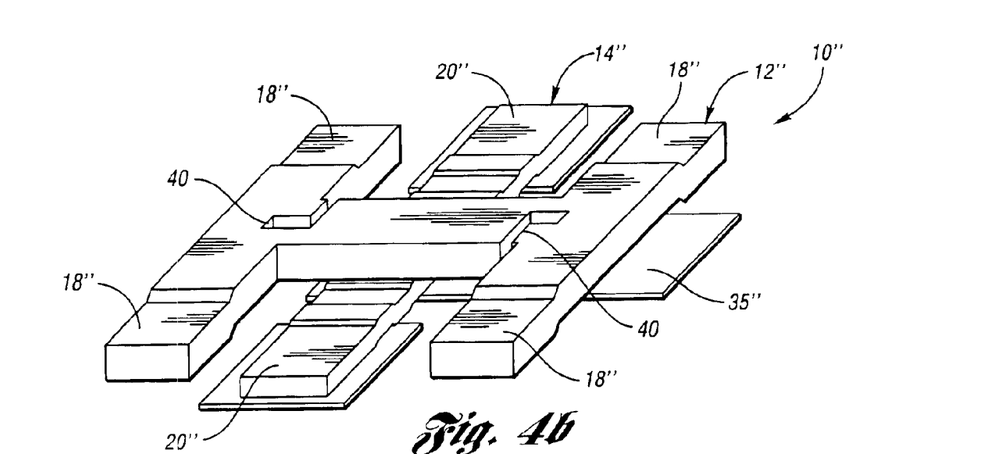
FIG. 4b is a perspective schematic view of yet another embodiment of a resonator of the invention, similar to the embodiment of FIG. 4a, but using cuts to alleviate lateral expansion-reduced areas in the top electrode plate.

Obviously, there are many geometries and electrode placements that can implement the fundamental premise of this invention: frequency compensation by a functionally dependent electrical spring stiffness. For example, FIGS. 4a and 4b present some additional devices 10' and 10", respectively, that attempt to mitigate possible warping of their top electrode 12' and 12", respectively, due to expansion-induced compression. Such devices 10' and 10" include beams 14' and 14" having anchors 20' and 20", respectively, which are driven by driving electrodes 35' and 35", respectively. Such warping might lead to nonlinearity in the electrical stiffness-versus-temperature transfer characteristic.

In FIG. 4a, the warping is reduced by using a split anchor or off-axis anchors 18' (as described in the above-noted patent application), which suppresses top-to-bottom stress differences at the anchor locations, and thus, suppresses warping (or rising) at the anchors 18'.

In FIG. 4b, cuts 40 in the top electrode material near anchors 18" of the electrode 12" are used to further alleviate any expansion stress in the electrode plate 12" itself.

In addition to the above, more radically different designs are also possible. For example, instead of using a top electrode 12, a bottom electrode made of a material that expands more slowly than the resonator structural material can be used with similar results (i.e., implementing an electrode-to-resonator gap spacing that increases with temperature).

In addition, this technique can be used to compensate against a variety of phenomena, not just temperature, that compromise the frequency stability of a mechanical resonator. For example, compensation that stabilizes the resonance frequency of a mechanical resonator against accelerations is feasible using an electrode for which the electrode-to-resonator gap distance is dependent upon the acceleration.

Figure 5:
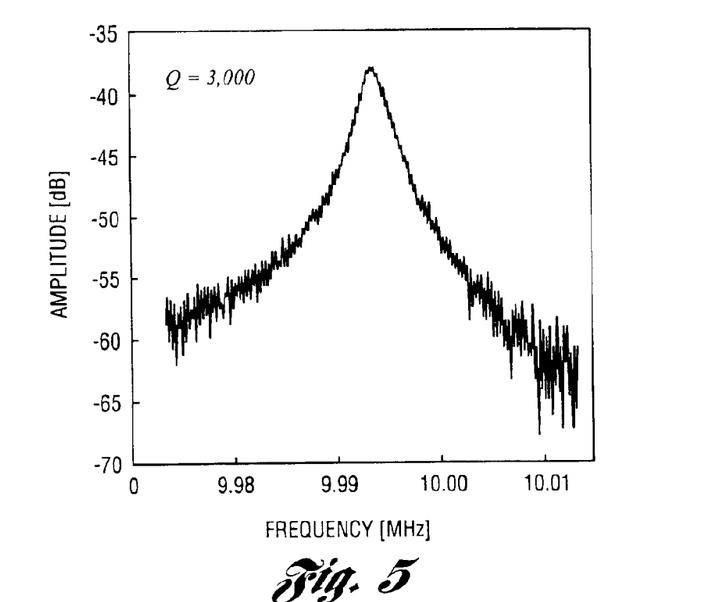

The measured frequency spectrum for the device 10 fabricated in accordance with FIG. 2a is shown in FIG. 5. The Q extracted from this plot is close to 3,000, which is high enough to attain good phase noise performance in an oscillator using this resonator device 10.

Figure 6:
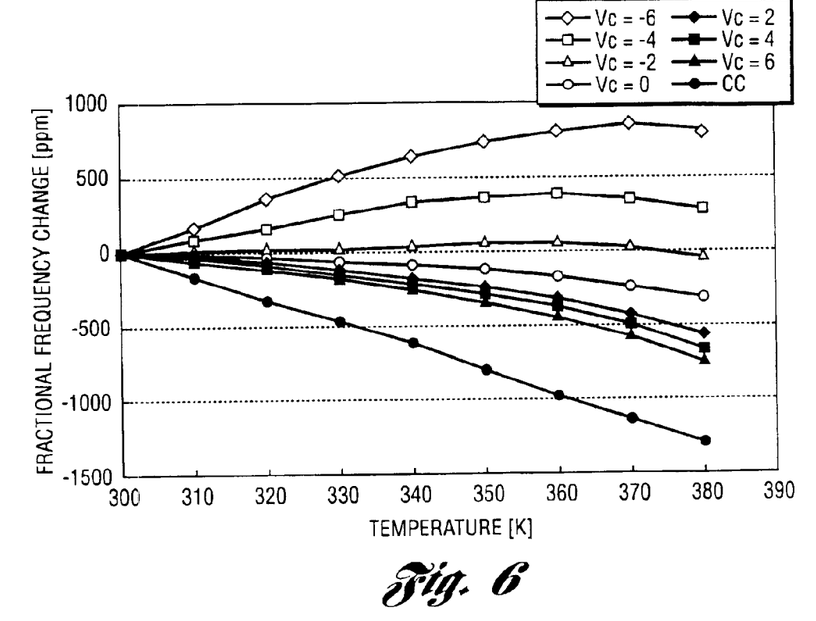

FIG. 6 presents a plot of fractional frequency change versus temperature for the resonator 10 of FIG. 2a with varying values of applied dc-bias $V_C$ across the top electrode-to-resonator gap 22. Clearly, the slope of the frequency-versus-temperature curve can be adjusted by adjusting the value of $V_C$. With $V_C$=−2V, the frequency-versus-temperature curve is flattest, achieving a $TC_f$=0.265 ppm/° C. from 340K to 360K° C., and a total frequency excursion of only 35 ppm from 300K to 360K.

Figure 7:
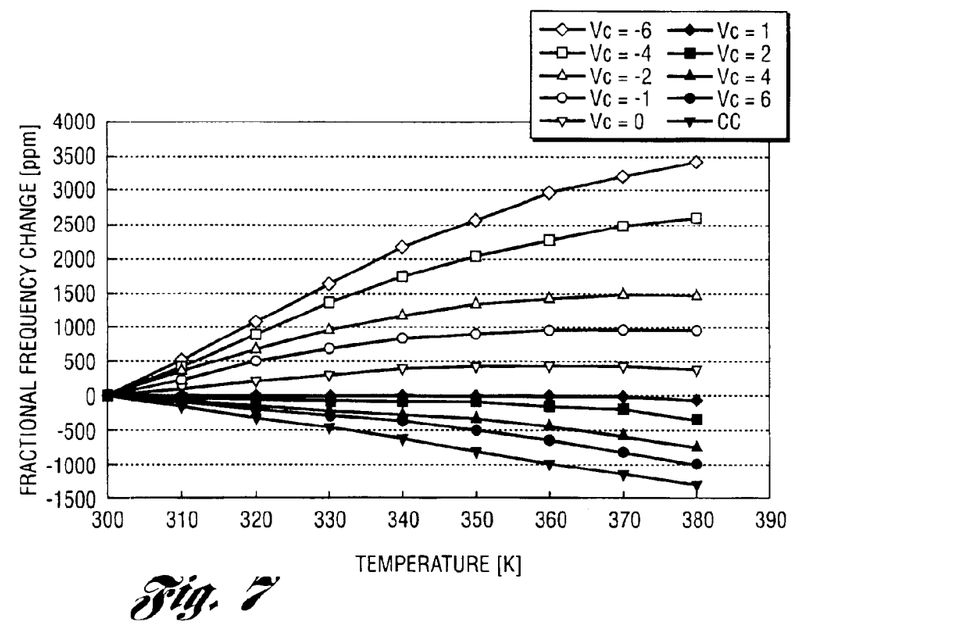
Figure 8:
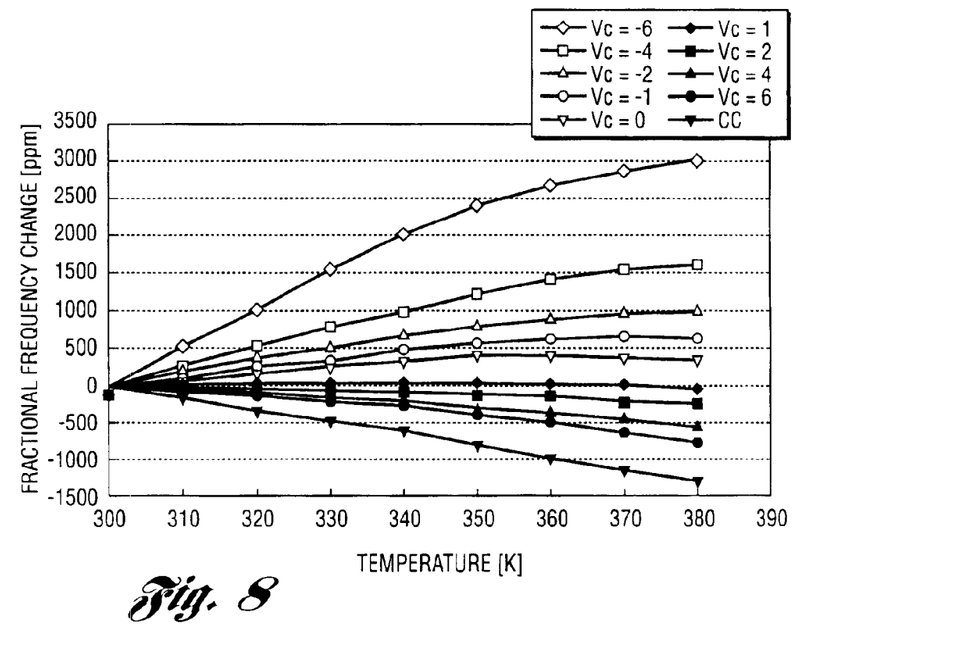
FIG. 8 are graphs or plots of fractional frequency change versus temperature for the resonator of FIG. 4b.

FIGS. 7 and 8 present similar data for the resonator devices 10' and 10" of FIGS. 4a and 4b, respectively, where total frequency excursions of 24 ppm and 37 ppm from 300K to 360K, respectively, are observed. Each of these designs also exhibits a zero $TC_f$ temperature point.

The main advantages and contributions of this invention are numerous. For example, the invention provides:

A method for greatly reducing the temperature coefficient of a micromechanical resonator's resonance frequency without the need for power consumption and without the need for stress compensation. This is extremely useful for reference oscillators in wireless communication applications, since such applications require the utmost in temperature stability for their frequency references.

A method for controlling the frequency of a micromechanical resonator as a function of temperature or other variables that might cause a change in electrical stiffness. This feature can be extremely useful in a variety of circuits that expect the resonator to have a predefined temperature response.

The process technology described allows the realization of a two-port, vertical, micromechanical resonator, which greatly enhances the design flexibility of micromechanical resonator circuits, such as filters and oscillators.

In summary, the present invention provides:

1) A general design technique in which electrical stiffnesses that change as a function of some parameter are used to influence the resonance frequency of a micromechanical resonator for the purposes of controlling the frequency-versus-parameter characteristic of a micromechanical resonator.
2) Same as 1), but using a geometric design that gives a flat frequency-versus-parameter curve.
3) A general design technique in which electrical stiffnesses that change as a function of temperature are used to influence the resonance frequency of a micromechanical resonator for the purposes of controlling the frequency-versus-temperature characteristic of a micromechanical resonator.
4) Same as 3), but using a geometric design that gives a flat frequency-versus-temperature curve.
5) A technique for fabricating a two-port, vertical, micromechanical resonator.

The micromechanical device and system of the invention utilizes a temperature-dependent electrical spring constant to compensate for temperature-induced (or generally induced) shifts in the resonance frequency of a mechanical resonator. Using this design, the temperature coefficient ($TC_f$) of a mechanical resonator can be substantially reduced without any additional power consumption, and a zero $TC_f$ temperature can be introduced at which a resonator may be biased via low-power oven control for even better temperature stability.

A feature in this resonator design that allows passive temperature compensation is the introduction of an electrode-to-resonator overlap capacitance for which the electrode-to-resonator gap spacing changes with temperature. In particular, for the case of temperature compensation (i.e., reduction of the temperature coefficient), the structure is designed so that the electrode-to-resonator gap increases with temperature, which causes the electrical stiffness to decrease, thereby raising the frequency of the resonator. This increase in frequency with increasing temperature then offsets and ideally cancels the decrease in frequency normally caused by the dependence of Young's modulus on temperature.

This design strategy can be employed to attain the needed temperature stability for reference oscillator applications in portable wireless communications and for RF channel-select filter banks. In addition, for cases where the thermal response of a resonator need not be nulled, but rather must satisfy a given shape, this technique could also be used to tailor a specific resonance frequency-versus-temperature curve.

The above-described design technique is not limited only to temperature or acceleration compensation, but can also be used to more generally tailor the frequency-versus-temperature curve for any mechanical resonator device. For example, the support structure might be designed to increase the temperature dependence of the resonator for use as a temperature sensor. Or the temperature curve might be tailored to have peaks and valleys in certain predefined locations.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A mechanical resonator device having a resonant frequency, the device comprising:
    a micromechanical resonator; and
    an electrode adjacent the micromechanical resonator to obtain an electrode-to-resonator gap wherein electrical stiffness generated across the gap is phenomena-dependent and wherein a control voltage between the electrode and the micromechanical resonator is applied to take instability of the resonant frequency caused by the phenomena into consideration rather than for excitation of the micromechanical resonator.

2. The device as claimed in claim 1, wherein the phenomena is temperature.

3. The device as claimed in claim 1, wherein the phenomena is acceleration.

4. The device as claimed in claim 1, wherein distance across the gap between the electrode and the resonator varies as a function of temperature.

5. The device as claimed in claim 4, further comprising supports for supporting the resonator and the electrode and wherein a material of the resonator and its supports expands at a different rate than a material of the electrode and its supports due to temperature.

6. The device as claimed in claim 1, wherein the device is substantially temperature-insensitive without the need for additional power consumption.

7. The device as claimed in claim 1, wherein the resonator is a polysilicon resonator.

8. The device as claimed in claim 7, wherein the resonator is a polysilicon resonator beam.

9. The device as claimed in claim 1, further comprising a substrate and supports for supporting the resonator and the electrode above the substrate.

10. The device as claimed in claim 9, wherein the substrate is a semiconductor substrate.

11. The device as claimed in claim 1, wherein the device has a frequency-versus-phenomena curve and wherein the frequency-versus-phenomena curve is specifically tailored.

12. The device as claimed in claim 1, wherein the device has a substantially zero temperature coefficient temperature at which the device may be biased.

13. The device as claimed in claim 1, wherein the device is a two-port, vertical, micromechanical resonator device.

14. The device as claimed in claim 1, wherein the electrode is supported above the resonator.

15. The device as claimed in claim 1, wherein distance across the gap and operating voltage of the electrode substantially cancel resonant frequency shifts caused by temperature.

16. The device as claimed in claim 1, further comprising a drive electrode structure formed at a position to allow electrostatic excitation of the resonator wherein the resonator and the drive electrode structure define a gap therebetween.

17. The device as claimed in claim 1, wherein the resonator is a single resonator beam.

18. The device as claimed in claim 1, wherein the electrode is metal electrode.

19. The device as claimed in claim 18, wherein the metal electrode is a plated metal electrode.

20. The device as claimed in claim 1, wherein the device is a phenomena sensor.

21. The device as claimed in claim 2, wherein the device is a temperature sensor.

22. The device as claimed in claim 3, wherein the device is an acceleration sensor.

23. The device as claimed in claim 1, wherein the supports for the electrode include at least one pair of off-axis anchors.

24. The device as claimed in claim 1, wherein the electrode is cut to reduce lateral expansion-induced stress in the electrode.

25. The device as claimed in claim 1, wherein the gap is a capacitive gap.

26. The device as claimed in claim 1, wherein the resonator is a flexural mode resonator.

27. The device as claimed in claim 1, wherein the control voltage is a bias voltage.

28. The device as claimed in claim 27, wherein the resonator is supported by a first structure, the electrode is supported by a second structure, the first and second structures comprise first and second materials, respectively, and the first and second materials have differing thermal expansion coefficients such that the gap varies during operation based on the differing thermal expansion coefficients.

29. A micromechanical resonator device, the device comprising:
    a resonator supported by a first structure; and
    an electrode supported by a second structure and adjacent the resonator to obtain an electrode-to-resonator gap spacing;
    wherein the first and second structure comprise first and second materials, respectively,
    the first and second materials have differing thermal expansion coefficients; and
    the gap spacing varies during operation based on the differing thermal expansion coefficients.

30. The device as claimed in claim 29, wherein a bias voltage is applied between the resonator and the electrode.

* * * * *